United States Patent
Nakahara et al.

(10) Patent No.: US 8,004,006 B2
(45) Date of Patent: Aug. 23, 2011

(54) NITRIDE SEMICONDUCTOR LIGHT EMITTING ELEMENT

(75) Inventors: Ken Nakahara, Kyoto (JP); Atsushi Yamaguchi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 77 days.

(21) Appl. No.: 12/084,634

(22) PCT Filed: Nov. 7, 2006

(86) PCT No.: PCT/JP2006/322175
§ 371 (c)(1),
(2), (4) Date: Jul. 17, 2009

(87) PCT Pub. No.: WO2007/055202
PCT Pub. Date: May 18, 2007

(65) Prior Publication Data
US 2009/0294784 A1 Dec. 3, 2009

(30) Foreign Application Priority Data

Nov. 8, 2005 (JP) .............................. P2005-324000

(51) Int. Cl.
*H01L 33/00* (2010.01)

(52) U.S. Cl. ........................................ 257/99; 257/103
(58) Field of Classification Search .................... 257/99, 257/103
See application file for complete search history.

(56) References Cited

U.S. PATENT DOCUMENTS

| 6,744,196 | B1* | 6/2004 | Jeon ............................... 313/498 |
| 2004/0061433 | A1* | 4/2004 | Izuno et al. .................... 313/498 |
| 2009/0046368 | A1* | 2/2009 | Banerjee et al. .............. 359/584 |

FOREIGN PATENT DOCUMENTS

| JP | 2001-244503 | 9/2001 |
| JP | 2003-168820 | 6/2003 |
| JP | 2004-165227 | 6/2004 |
| JP | 2005-045054 | 2/2005 |
| JP | 2005-259832 | 9/2005 |
| WO | WO-03/034508 | 4/2003 |

* cited by examiner

*Primary Examiner* — Thomas L Dickey
(74) *Attorney, Agent, or Firm* — Rabin & Berdo, P.C.

(57) ABSTRACT

Provided are a nitride semiconductor light emitting element which does not suffer a damage on a light emitting region and has a high luminance without deterioration, even though the nitride semiconductor light emitting element is one in which electrodes are disposed opposite to each other and an isolation trench for chip separation and laser lift-off is formed by etching; and a manufacturing method thereof. An n-type nitride semiconductor layer 2 has a step, formed in a position beyond an active layer 3 when viewed from a p side. Up to the position of this step A, a protective insulating film 6 covers a part of the n-type nitride semiconductor layer 2, the active layer 3, a p-type nitride semiconductor layer 4, the side of a p electrode 5 and a part of the top side of the p electrode 5. The use of a structure having a chip side face covered with the protective insulating film 6 prevents the active layer or the like from being exposed to an etching gas for a long time when an isolation trench for chip separation or laser lift-off is formed by etching.

4 Claims, 8 Drawing Sheets

FACE ROUGHENING PROCESSED

NITRIDE SEMICONDUCTOR LIGHT EMITTING ELEMENT

TECHNICAL FIELD

The present invention relates to a nitride semiconductor light emitting element in which electrodes are disposed opposite to each other and a method for producing the nitride semiconductor light emitting element.

BACKGROUND ART

Nitride semiconductors are used in a blue LED, an LED and LD used for multi-color, and the like which are used as light sources of illumination and back light.

In nitride semiconductor manufacturing, bulk single crystal production is difficult, and thus GaN is grown on a different kind of substrate such as a sapphire substrate, or a SiC substrate by use of MOCVD (metal organic chemical vapor deposition). Since exhibiting excellent stability in high-temperature ammonium atmospheres in epitaxial growth steps, a sapphire substrate is particularly used as a substrate for growth. However, the sapphire substrate is an insulating substrate and does not show conductivity, whereby electrodes cannot be disposed with the substrate intervening therebetween.

Therefore, a nitride semiconductor on a sapphire substrate generally employ a structure in which two electrodes of p and n types are disposed on the same face side of the substrate by etching the nitride semiconductor after epitaxial growth until an n-type gallium nitride is exposed, and by forming an n-type contact on the etched face.

In the structure in which two electrodes of p and n types are disposed on the same face side as described above, however, currents tend to be concentrated on a mesa part close to the n electrode, whereby the ESD (electrostatic breakdown) voltage cannot be raised. In addition, it is difficult to uniformly inject currents into an active layer and also difficult to cause the active layer to emit light uniformly. Furthermore, the p and n electrodes need electrodes for wire bonding, respectively, on the same face side, so that the effective light emitting area is reduced as compared with a nitride semiconductor on a conductive substrate which requires only either one of the electrodes for wire bonding to be disposed. This increases the chip (element) area, decreasing the number of chips to be produced from one wafer. Moreover, because sapphire has high hardness and a hexagonal crystal structure, the sapphire substrate needs to be separated into chips by scribing when sapphire is used for a substrate for growth, making manufacturing steps complicated and the yield bad.

Meanwhile, a flip chip type has been proposed as a structure of a nitride semiconductor element using a sapphire substrate for improving light output efficiency. In this type of structure, a p-type layer is disposed under the sapphire substrate, and thus light is emitted from the sapphire substrate. The flip chip type has an advantage of being brighter owing to the effects that the escape cone is larger since the difference of the refractive index between sapphire and air is smaller than that between GaN and air, and that the amount of light emitted from lateral directions also is larger because the sapphire substrate, although being made thinner by grinding or the like, still has a residual sapphire thickness from 60 μm to 80 μm. However, even in this flip chip type, both the electrodes of p and n types are present on the same face side, whereby any of the above problems cannot be solved.

On the other hand, if electrodes are disposed to be opposite to each other using a conductive substrate or the like, the above problems can be solved. However, SiC of a conductive substrate usable for nitride gallium is costly at present and the amount of light absorption becomes large when an impurity is doped in a substrate to make the substrate conductive.

In order to solve these problems, a method is used that includes peeling a sapphire substrate, exposing an n-type gallium nitride layer, and then forming an n electrode thereon. For example, there is a laser lift-off (hereinafter referred to as LLO) method that includes forming a compound crystal layer, serving as a nitride semiconductor, on a sapphire substrate with a GaN buffer layer interposed therebetween; irradiating the resultant substrate from the sapphire substrate side with an excimer laser beam of approximately 300 nm or less at a several hundred mJ/cm$^2$; and decomposing the GaN buffer layer to peel the sapphire substrate. This method can produce a chip equivalent to a chip produced by use of a GaN substrate, so that electrodes can be disposed to be opposite to each other, thereby being capable of technically solving the above problems.

However, implementation of LLO decomposes a GaN buffer layer to generate N$_2$ gas and thus applies shear stress to the GaN buffer layer and the nitride semiconductor, whereby the border part of a region irradiated with laser light frequently has cracks. For the prevention of cracks caused by generation of this N$_2$ gas, for example as illustrated in FIG. 13, isolation trenches 24 are formed by dry-etching to reach a sapphire substrate 21 and to have a size allowing a GaN buffer layer 22 and a nitride semiconductor 23 to be divided into elements. The GaN buffer layer 22 is formed on the sapphire substrate 21 and functions as a separating layer, and the nitride semiconductor 23 is grown on the GaN buffer layer 22 and has a light emitting region.

Next, when a laser beam is radiated from behind the sapphire substrate 21, the GaN buffer layer 22 absorbs a laser beam to be decomposed into Ga and N and generate a N$_2$ gas. However, the N$_2$ gas is discharged from the isolation trenches 24, thereby this prevents excess stress due to the N$_2$ gas from being applied to the crystal layer of the nitride semiconductor 23.

Patent Document 1: JP-A 2003-168820

DISCLOSURE OF THE INVENTION

Problem to be Solved by the Invention

However, although the above described method can reduce shear stress due to N$_2$ gas during laser lift-off (LLO), thereby preventing cracks of the nitride semiconductor 23, a dry etching time is increased because the isolation trenches 24 for discharging N$_2$ gas need to be formed until the isolation trenches 24 reach the sapphire substrate 21. Furthermore, a time period when a light emitting region side of the nitride semiconductor 23 is exposed to an etching gas (plasma) is increased and, therefore the light emitting region is damaged. This causes an increase in leakage current and ESD deterioration and luminance deterioration due to the increase in leakage current.

In addition, even when a sapphire substrate is removed by grinding without use of LLO, the isolation trenches 24 are sometimes formed by etching to the sapphire substrate 21 in order to prevent cracks of a nitride semiconductor layer and facilitate chip separation. Even at a time like this, as in the above case, the time when the light emitting region side face is exposed to plasma is increased, and accordingly the light emitting region is damaged. This causes an increase in leakage current and ESD deterioration and luminance deterioration due to the increase in leakage current.

The present invention has been made by solving the above described problems and an object thereof is to provide a nitride semiconductor light emitting element which does not suffer a damage on a light emitting region and has a high luminance without deterioration, even though the nitride semiconductor light emitting element is one in which electrodes are disposed to be opposite to each other and in which isolation trenches for chip separation and laser lift-off are formed by etching; and to provide a manufacturing method of the nitride semiconductor light emitting element.

Means for Solving the Problem

For the achievement of the above object, the invention described in claim 1 is a nitride semiconductor light emitting element including at least an n side electrode, an n-type nitride semiconductor layer, a light emitting region, a p-type nitride semiconductor layer and a p side electrode in listed order, characterized by comprising a step provided between the light emitting element and the n side electrode, and characterized in that a first protective insulating film is formed in a laminated direction from the n side electrode to the position of the step.

In addition, the invention described in claim 2 is the nitride semiconductor light emitting element described in claim 1 characterized in that the above first protective insulating film has a smaller refractive index than the above n-type nitride semiconductor layer and the above p-type nitride semiconductor layer.

Additionally, the invention described in claim 3 is the nitride semiconductor light emitting element described in either of claim 1 or 2 characterized in that outside the above first protective insulating film a second protective insulating film is formed outside the first protective insulating film, the second protective insulating film having a smaller refractive index than that of the first protective insulating film.

Moreover, the invention described in claim 4 is a method for producing a nitride semiconductor light emitting element including at least an n-type nitride semiconductor layer, a light emitting region, and a p-type nitride semiconductor layer in listed order, on a substrate for growth, the method being for forming an isolation trench for separating the semiconductor layers by etching until the isolation trench reaches the substrate for growth from the p-type nitride semiconductor layer, characterized by comprising: performing etching up to a position beyond the light emitting region to form a first isolation trench; stopping the etching thereafter; forming a first protective insulating film in a laminated direction till the depth of the first isolation trench; and extending further the first isolation trench by etching to form a second isolation trench reaching the substrate for growth.

Furthermore, the invention described in claim 5 is the method for producing a nitride semiconductor light emitting element described in claim 4, characterized by comprising: joining a supporting substrate to the top face of the grown layers so that the supporting substrate is opposite to the substrate for growth, after forming the second isolation trench; and then separating the substrate for growth.

According to the present invention, n and p electrodes are disposed to be opposite to each other on a nitride semiconductor layer, and even for a nitride semiconductor light emitting element in which an isolation trench for chip separation or laser lift-off is formed by etching, the side face from a p electrode to a step position disposed on an n-type nitride semiconductor layer exceeding a light emitting region is covered with a protective insulating film, so the light emitting region and the like can be protected without exposing to etching gas for a long period of time.

In addition, when the second protective insulating film is formed on top of the outside of the first protective insulating film, if the refractive index of the second protective insulating film is made smaller than that of the first protective insulating film, a part of light emitted to the side face can be reflected by total reflection and taken out, whereby the light output efficiency can be increased.

DESCRIPTION OF SYMBOLS

1 N ELECTRODE
2 N-TYPE NITRIDE SEMICONDUCTOR LAYER
3 ACTIVE LAYER
4 P-TYPE NITRIDE SEMICONDUCTOR LAYER
5 P ELECTRODE
6 PROTECTIVE INSULATING FILM
61 PROTECTIVE INSULATING FILM
7 CONDUCTIVE FUSION LAYER
8 SUPPORTING SUBSTRATE
9 PROTECTIVE INSULATING FILM
91 PROTECTIVE INSULATING FILM
92 PROTECTIVE INSULATING FILM
10 REFLECTIVE FILM
11 SAPPHIRE SUBSTRATE
12 GaN BUFFER LAYER
13 MASK
14 MASK
17 CONTACT HOLE

BEST MODE FOR CARRYING OUT THE INVENTION

Figure 1:
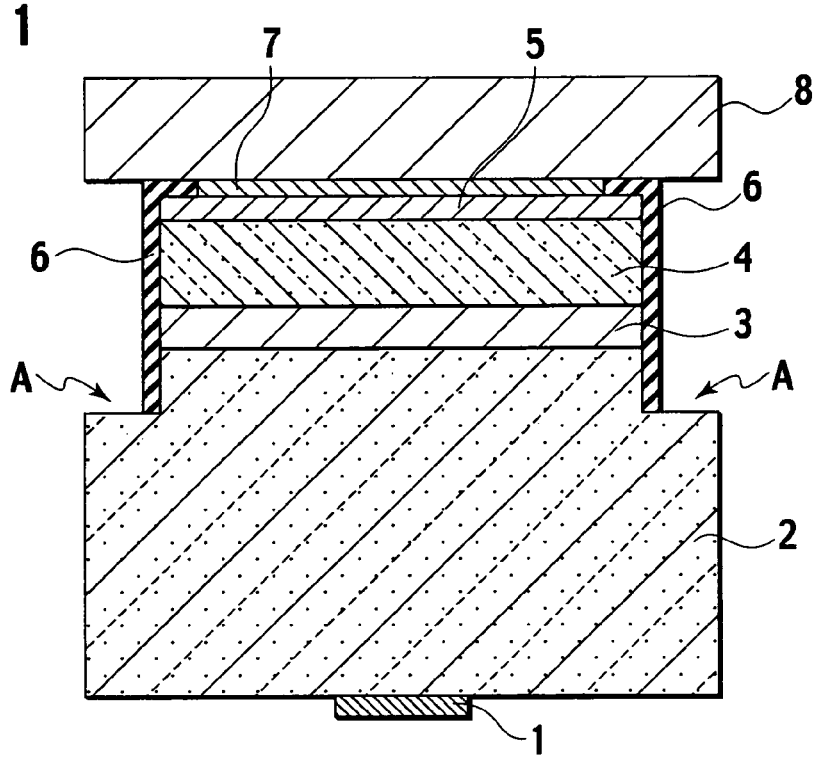
FIG. 1 is a diagram indicating a cross-sectional structure of a first nitride semiconductor light emitting element of the present invention.

Hereinafter, one embodiment of the present invention will be described with reference to drawings. FIG. 1 shows a cross-sectional structure of a first nitride semiconductor light emitting element according to the present invention.

Nitride semiconductors also known as III-V group semiconductors include elements such as Al, Ga and In selected from the III group of the periodic table and an element N of the V group. The nitride semiconductor may be a binary alloy crystal such as gallium nitride (GaN), a tertiary alloy crystal such as aluminum gallium nitride (AlGaN) or indium gallium nitride (InGaN), or a quaternary alloy crystal such as aluminum gallium indium nitride (AlGaInN). These materials are deposited onto substrates to produce laminated semiconductor structures usable as light emitting elements used for optoelectronic devices. Nitride semiconductors have a wide band gap necessary for emission of visible light having a short wavelength in green-blue-violet-ultraviolet spectra.

The present example, although using a tertiary alloy crystal system of InGaN, is not limited to the InGaN, as described above. An n-type nitride semiconductor layer 2 and a p-type nitride semiconductor layer 4 are formed with an active layer 3 interposed therebetween to have a double hetero structure and serve as a light emitting region. The active layer 3 has a multiple quantum well structure constituted by, for example, InGaN/GaN, in which InGaN as a well layer and undoped GaN as a barrier layer (an obstacle layer) are alternately laminated. The barrier layer can also use InGaN having an In content ranging from 0.5% to 2%. Incidentally, although the active layer 3 is disposed as the light emitting region, the n-type nitride semiconductor layer 2 may be directly joined to the p-type nitride semiconductor layer 4 as pn junction without disposing the active layer 3. In this case, the light emitting region is a pn junction interface part.

The n-type nitride semiconductor layer 2 includes, for example, an n-type impurity Si-doped GaN contact layer and an n-type impurity Si-doped InGaN/GaN super lattice layer laminated on the n-type GaN contact layer. This super lattice layer relaxes a stress between InGaN and GaN having a large lattice constant difference, making easy the growth of InGaN of an active layer. On the other hand, the p-type nitride semiconductor layer 4 includes, for example, a p-type impurity doped GaN contact layer. An n electrode 1 is formed under the n-type nitride semiconductor layer 2, and a p electrode 5 is formed on top of the p-type nitride semiconductor layer 4. The n electrode 1 is constituted by a laminate of Ti and Al, or Al or the like and is in ohmic contact with the n-type nitride semiconductor layer 2. Although the p electrode 5 can utilize a laminate of Ni and Au or the like, a transparent electrode is preferable if the light output efficiency is taken into account. The p electrode 5 can be an electrode in ohmic contact by use of, for example, ZnO.

A conductive bond layer 7 joins the p electrode 5 to a supporting substrate 8 and may also be a brazing filler metal such as solder. For thermo-compression bonding, a multilayer metal film of Ti and Au, Au only, a multilayer metal film of an alloy of Au and Sn and Ti, or the like is used. The p electrode 5 is electrically connected to the supporting substrate 8 via the conductive bond layer 7. The supporting substrate 8 is used for reapplication of a nitride semiconductor grown on a sapphire substrate, and a conductive substrate is frequently used as the supporting substrate 8. A material such as GaN, silicon, or SiC is used as such a conductive substrate, and Cu, AlN or the like is used as a high thermal conductive submount. When AlN is used for the supporting substrate, which is an insulative substrate, it is advantageous when a chip is mounted on a circuit such as a printed board. When the supporting substrate 8 uses a conductive substrate, an external connecting terminal or the like is disposed on the opposite side of the conductive bond layer 7 formed on the supporting substrate 8 and is connected to an external electric terminal.

Incidentally, in the n-type nitride semiconductor layer 2, a step A is formed in a region exceeding the active layer 3, when viewed from the p side. The protective insulating film 6 as the first protective insulating film covers, to the part, the step A, a part of the n-type nitride semiconductor layer 2, the active layer 3, the p-type nitride semiconductor layer 4, a side face of the p electrode 5 and an upper part of the p electrode 5 (a part except a contact hole). For instance, for a light emitting diode element, the protective insulating film 6 is circularly formed in the periphery of a chip. For a semiconductor laser, the protective insulating film is formed on both the side faces of a chip so as to obtain a resonator structure. The protective insulating film 6 uses SiN, SOG (Spin On Glass), or the like.

In this manner, due to the structure in which the protective insulating film 6 covers a region from the position of the step A to the side upper face of the chip, the protective insulating film 6 protects a part of the n-type nitride semiconductor layer 2, the active layer 3 serving as a light emitting region and the p-type nitride semiconductor layer 4, when an isolation trench for isolating every element is formed by etching, or when an isolation trench for discharging $N_2$ gas generated due to LLO is formed by etching. This can prevent deterioration of the element without exposure to etching gas (plasma) for a long period of time.

Although light generated in the active layer 3 of the nitride semiconductor light emitting element by the constitution of FIG. 1 is taken out in the direction of the n electrode 1 (the downward direction of the drawing), when the refractive index of the protective insulating film 6 is made smaller than any of the refractive indexes of the n-type nitride semiconductor layer 2, the active layer 3 and the p-type nitride semiconductor layer 4, part of light emitted from the inside of the element toward the side face is totally reflected on the interface between each semiconductor layer and the protective insulating film 6, whereby the light output efficiency is improved. As described above, when the protective insulating film 6 uses SiN or SOG, the refractive index of the protective insulating film 6 becomes smaller than that of each semiconductor layer containing GaN.

Hereinafter, with reference to FIGS. 6 to 12, a method for producing a nitride semiconductor light emitting element of the present invention will be set forth. At first, the method is described with reference to FIG. 6. First, a sapphire substrate 11 as a substrate for growth is placed in an MOCVD (metal organic chemical vapor deposition) apparatus and its temperature is increased to about 1050° C. while hydrogen gas is streamed to thermally clean the sapphire substrate 11. The temperature is decreased to about 600° C. and at the low temperature a GaN buffer layer 12 to become a separating layer is grown.

The above first step can also be performed in the following. For example, the sapphire substrate is placed in a PLD (Pulsed Laser Deposition) apparatus and the sapphire substrate 11 is cleaned at 600° C. to 800° C. while gas is streamed. A GaN buffer layer 12 including a GaN single crystal may be grown by performing ablation by KrF laser using GaN as a target. Thereafter, the resulting material is transferred into an MOCVD (metal organic chemical vapor deposition) apparatus and a film is grown as in the above.

The temperature within the MOCVD apparatus is raised again to about 1000° C. and the n-type nitride semiconductor layer 2 is laminated on the GaN buffer layer 12. The n-type nitride semiconductor layer 2 includes, for example, an n-type impurity Si doped GaN contact layer and an n-type impurity Si doped InGaN/GaN super lattice layer. Accordingly, first, the n-type impurity Si doped GaN contact layer is grown on the GaN buffer layer 12 and further thereon is grown the n-type impurity Si doped InGaN/GaN super lattice layer.

Next, the active layer 3 is formed. The active layer 3 has, as one example, an MQW layer (a multiple quantum well structure layer) made from InGaN/GaN. $In_{0.17}GaN$ of 20 Å to 40 Å, desirably from 25 Å to 35 Å, as a well layer and an undoped GaN layer or an InGaN layer having an In content of about 1%, of 50 Å to 300 Å, desirably from 100 Å to 200 Å, as a barrier layer are alternately laminated on each other. The active layer is grown to have a multi-layer structure of, for example, 3 to 10 cycles, desirably 5 to 8 cycles. Incidentally, in an InGaN well layer having a high In content, In is easily sublimed at a high temperature and the InGaN well layer is easily degraded, so an undoped GaN layer functioning as a cap layer or an InGaN layer having an In content of about 1% is laminated on the active layer 3. Subsequently, the temperature is raised to grow the p-type nitride semiconductor layer 4. The p-type nitride semiconductor layer 4 includes, for example, a p-type impurity Mg doped GaN contact layer and the like.

Then, when a Ga doped ZnO electrode is used, for example, as the p electrode 5, a Ga doped ZnO electrode having a low resistance of about $2e^{-4}$ Ωcm is laminated by means of a molecular beam epitaxy method and etched according to the shape of a chip. A mask 13 is formed according to the shape of the chip using a dielectric film such as $SiO_2$ or a resist.

Figure 7:
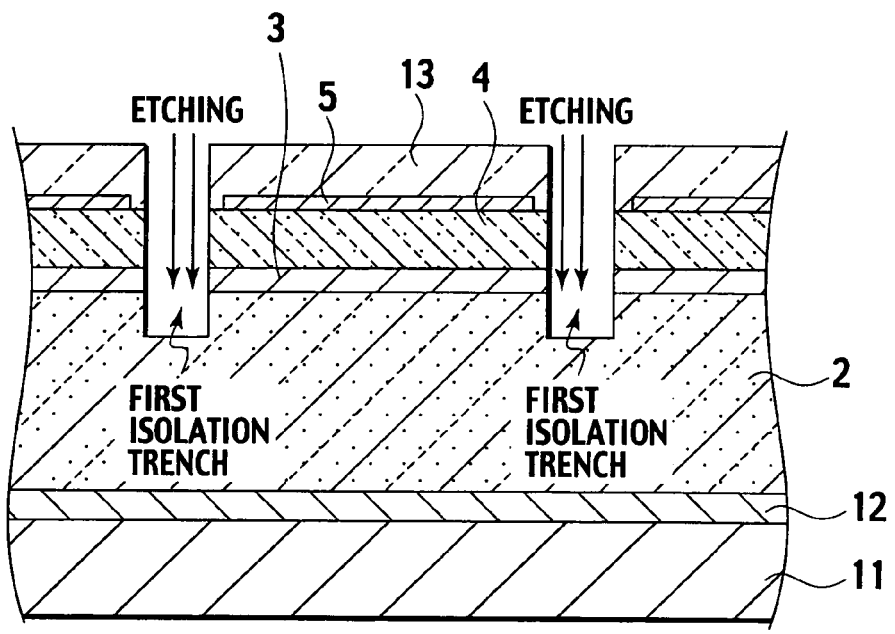
FIG. 7 is a diagram indicating a step of manufacturing the nitride semiconductor light emitting element.

Next, as shown in FIG. 7, the first isolation trench is formed by performing mesa etching by use of ICP or the like. Mesa etching is performed through the active layer 3 until the n-type GaN contact layer in the n-type nitride semiconductor layer 2 is exposed and is once stopped.

Figure 8:
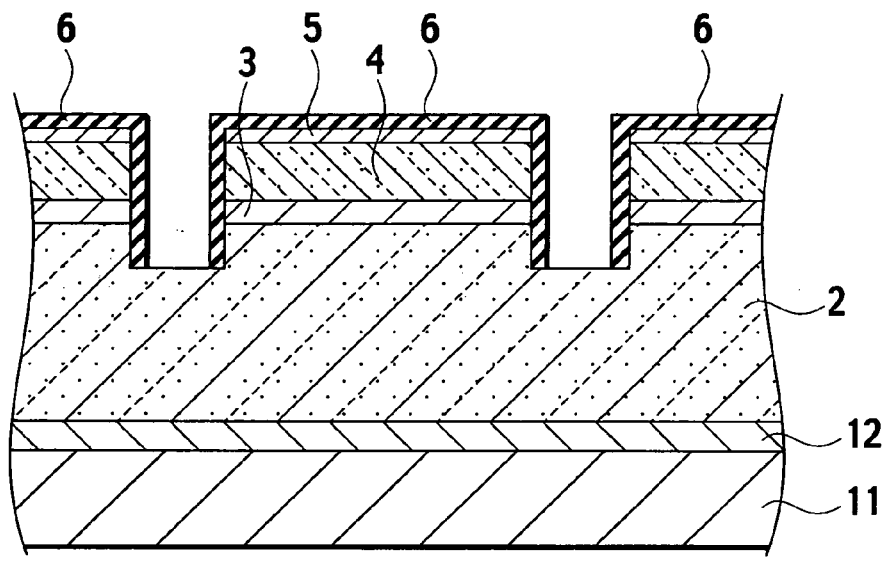
FIG. 8 is a diagram indicating a step of manufacturing the nitride semiconductor light emitting element.
Figure 9:
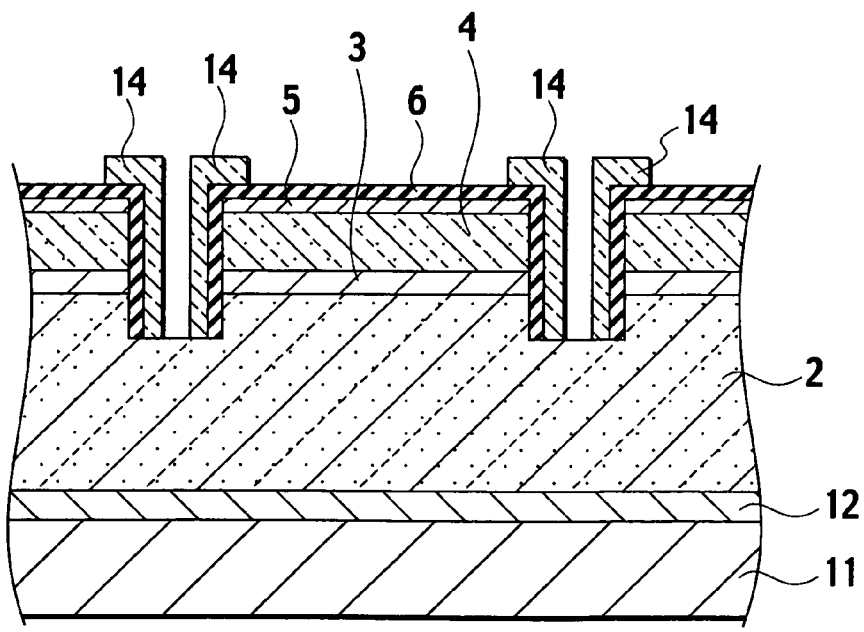
FIG. 9 is a diagram indicating a step of manufacturing the nitride semiconductor light emitting element.

After a lift-off of the mask 13, the protective insulating film 6 is formed, as shown in FIG. 8, so as to cover all portions from the top face of the p electrode 5 to the lower end of the first isolation trench, by P-CVD or sputtering. The interval between adjacent elements is left open wide enough not to bury the inside of the first isolation trench by the protective insulating film 6. The protective insulating film 6 is circumferentially formed in the periphery of a chip for a light emitting diode element, and is formed on both the side faces of a chip so as to obtain a resonator structure for a semiconductor laser. Also, as illustrated in FIG. 9, the patterning of the mask 14 is performed according to the contact hole shape by use of a dielectric film of $SiO_2$ or the like or a resist.

Figure 10:
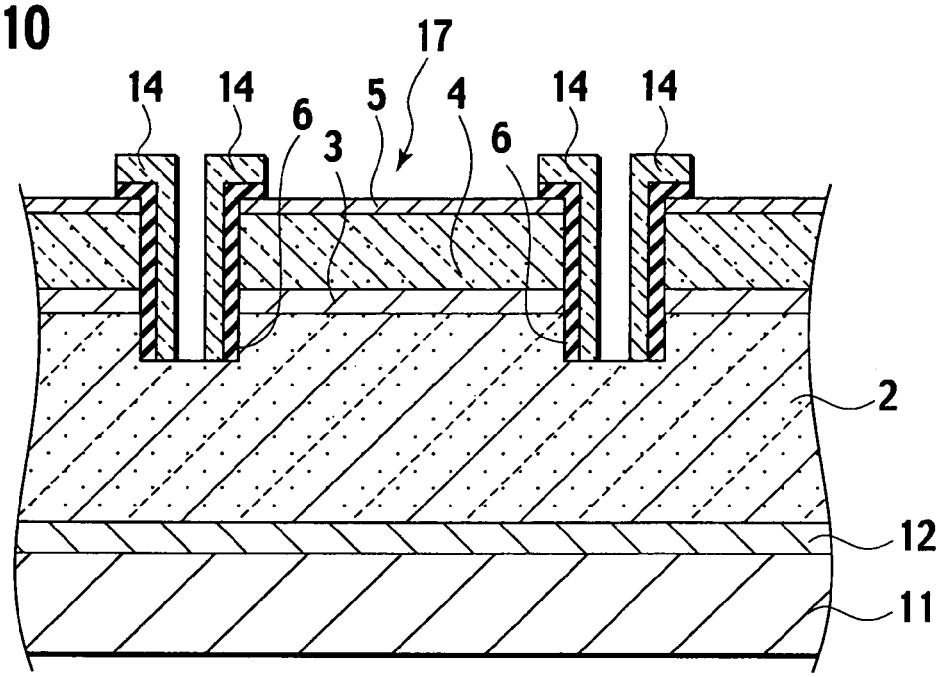
FIG. 10 is a diagram indicating a step of manufacturing the nitride semiconductor light emitting element.

Then, as indicated in FIG. 10, a part of the protective insulating film 6 corresponding to a region of a contact hole 17 is removed by dry etching using a CF4 chemical to form the contact hole for the p electrode 5. The present example uses a ZnO electrode for the p electrode 5, and in dry etching using a CF4 chemical, the etching rate of ZnO is lower than that of the protective insulating film 6, so ZnO itself plays a role to stop etching.

Figure 11:
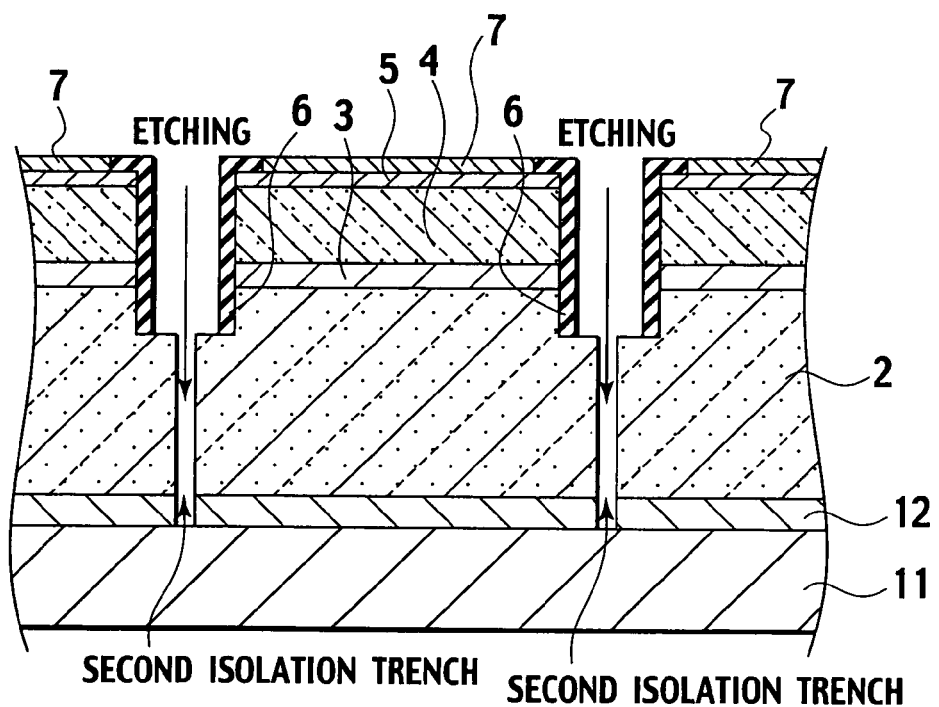
FIG. 11 is a diagram indicating a step of manufacturing the nitride semiconductor light emitting element.

After the contact hole 17 is formed and the mask 14 is lifted off, the conductive bond layer 7 is formed by vapor deposition. As shown in FIG. 11, etching temporarily stopped in the process of FIG. 7 is resumed and etching is carried out until the sapphire substrate 11 is exposed to form the second isolation trench. In this etching, the regions such as the active layer 3 serving as a light emitting region and the p-type nitride semiconductor 4 on which the protective insulating film 6 is already disposed are not exposed to etching gas (plasma), whereby deterioration can be prevented. The trench width of the second isolation trench is smaller than the width of the first isolation trench illustrated in FIG. 7.

Figure 12:
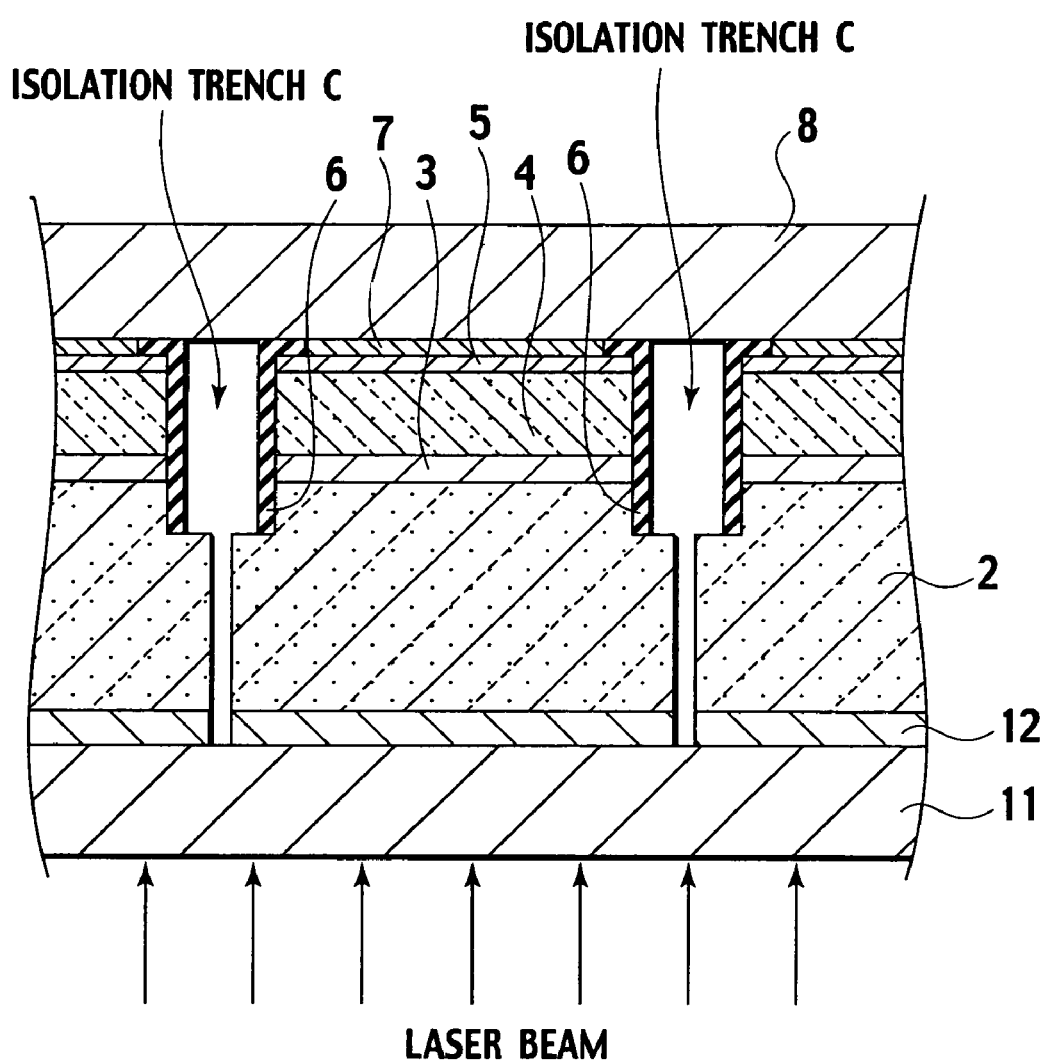
FIG. 12 is a diagram indicating a step of manufacturing the nitride semiconductor light emitting element.
Figure 13:
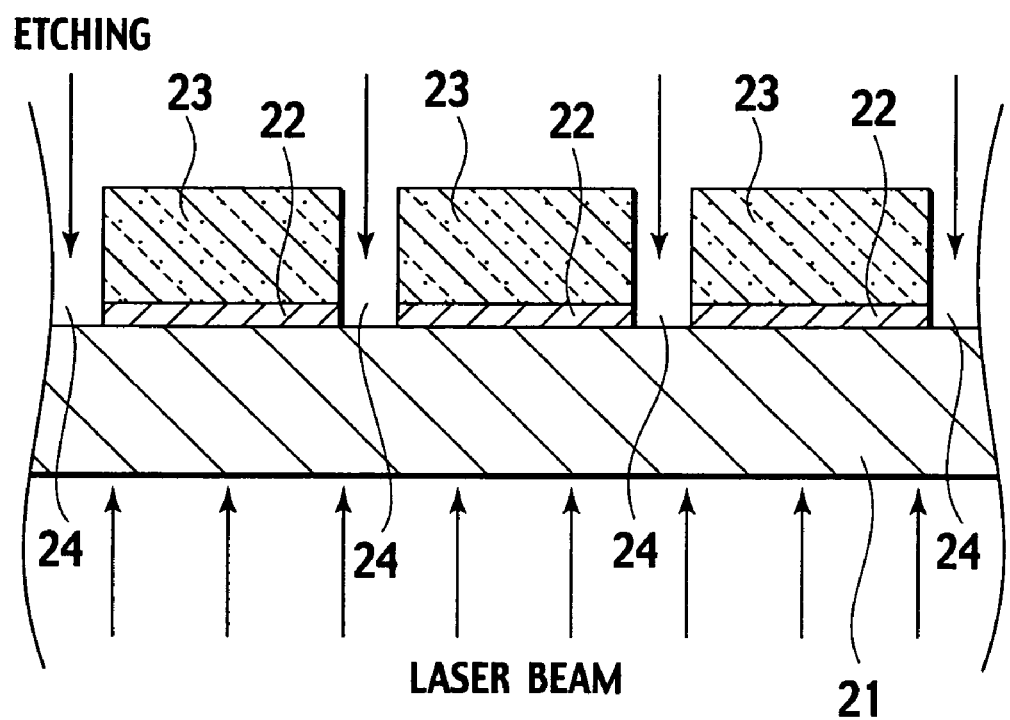
FIG. 13 is a diagram indicating a step of manufacturing the conventional nitride semiconductor light emitting element.

After the completion of etching, as indicated in FIG. 12, the supporting substrate 8 is placed on the uppermost layer of the growth layers on the substrate for growth (the sapphire substrate 11) and is affixed to a laminate illustrated in FIG. 11 via the conductive bond layer 7 by utilization of thermo-compression or the like. Here, isolation trench C=the first isolation trench+the second isolation trench is shown. This isolation trench C serves as a prevention of cracks on the nitride semiconductor layer and as an element isolation trench for separation of every element (every chip). To prevent the cracks of the nitride semiconductor layer, $N_2$ gas is discharged which is generated due to decomposition of the GaN buffer layer 12, when LLO is used for removing the sapphire substrate 11.

Next, if the sapphire substrate 11 is removed by LLO, a KrF laser oscillating at 248 nm is radiated from the sapphire substrate 11 side toward the GaN buffer layer 12 to detach the sapphire substrate 11. The laser can utilize, in addition to KrF, ArF: 193 nm, XeCl: 308 nm, YAG third harmonic: 355 nm, Sapphire: Ti third harmonic: 360 nm, He—Cd: 325 nm, or the like.

For KrF, the required irradiation energy is from 50 $mJ/cm^2$ to 500 $mJ/cm^2$, desirably from 100 $mJ/cm^2$ to 400 $mJ/cm^2$. Since the light of 248 nm is transmitted almost completely through the sapphire substrate 11 and is absorbed almost 100% in the GaN buffer layer 12, the temperature rapidly rises at the interface between the sapphire substrate 11 and the GaN buffer layer 12. Thereby GaN of the GaN buffer layer 2 is decomposed. $N_2$ generated at this time is flowed to a void of the isolation trench C, so pressure is not applied to the nitride semiconductor layer. This can effectively prevent cracks. After detachment of the sapphire substrate 11, extra Ga is flowed by etching using an acid and the n electrode 1 is formed. The n electrode 1 is formed of a multilayer metal film, and includes Al/Ni/Au or Al/Pd/Au, or Ti/Al/Ni/Au or Ti/Al/Ti/Au or the like.

Thereafter, the supporting substrate 8 is cut by dicing or the like to separate it to have a chip shape, thereby a nitride a semiconductor light emitting element as shown in FIG. 1 is completed. Because the protective insulating film 6 covers a part of the n-type nitride semiconductor layer 2, the active layer 3, the p-type nitride semiconductor layer 4, and the like, short circuit during chipping by dicing or the like at the time of making a chip can be prevented.

Figure 2:
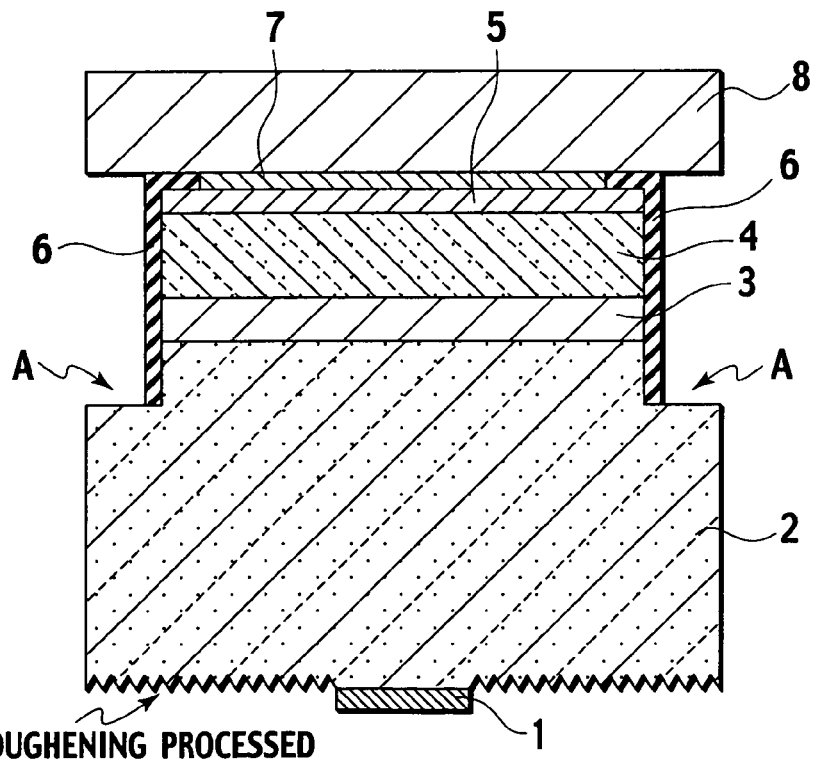
FIG. 2 is a diagram indicating a cross-sectional structure after the first nitride semiconductor light emitting element of FIG. 1 is subjected to surface roughening processing.

The light output face of the n-type nitride semiconductor 2 (face of the n electrode 1 side) may be finished up like a mirror face as in FIG. 1, or may also be a surface (surface with concaves and convexes formed) subjected to surface roughening processing as shown in FIG. 2 for an increase in light output efficiency. Due to the presence of a critical angle caused by the refractive index difference between the n-type nitride semiconductor 2 and the atmosphere, outgoing light having an incident angle larger than the critical angel cannot be taken out because of its total reflection. Thus, the ratio such that the incident angles is smaller than the critical angle is increased by the formation of concaves and convexes to increase light output efficiency.

With surface roughening processing, prior to the formation of the n electrode 1, a region in which the n electrode 1 is laminated is covered with a mask of SOG, SiN or the like in a manufacturing step of FIG. 12, and etching is performed using KOH and UV light containing a wavelength of 365 nm to form concaves and convexes on the exposure face of the n-type nitride semiconductor layer 2. Next, the mask is peeled to form the n electrode 1.

Figure 3:
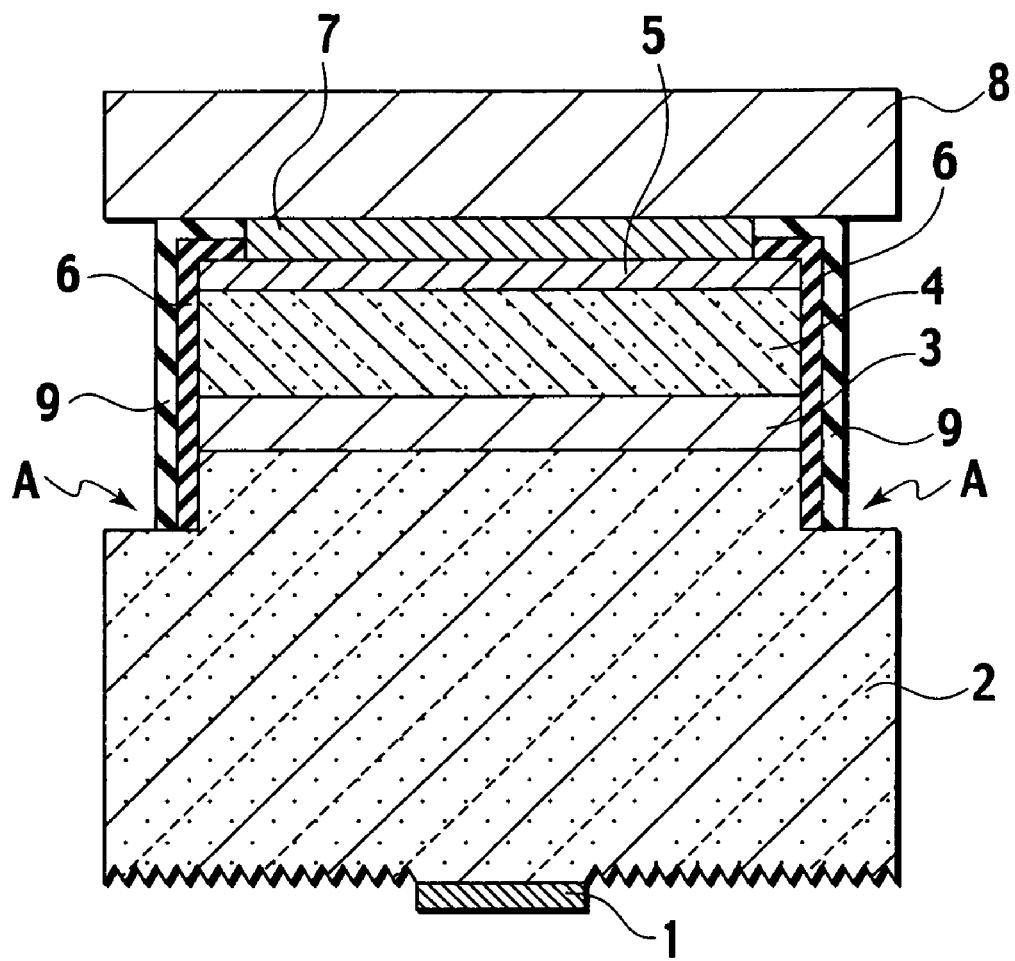
FIG. 3 is a diagram indicating a cross-sectional structure of a second nitride semiconductor light emitting element of the present invention.

FIG. 3 illustrates a cross-sectional structure of a second nitride semiconductor light emitting element. In each drawing, a part to which the same reference numeral is assigned has the same constitution. Differently than in FIG. 2, the element has a structure in which the protective insulating film is doubled. Outside the protective insulating film 6, a protective insulating film 9 is disposed as a second protective insulating film. In the case of a light emitting diode element, the protective insulating film 9 is circumferentially formed in the periphery of a chip, like the protective insulating film 6. In the case of a semiconductor laser, the protective insulating film 9 is formed on both the side faces of a chip so as to obtain a resonator structure.

The refractive index of the protective insulating film 9 is made smaller than the refractive index of the protective insulating film 6. Although light of a nitride semiconductor light emitting element is taken out from the inside of the chip toward the n electrode 1 direction, light emitted from the active layer 3 is radiated to the upward, downward, left and right directions, i.e., 360° directions, thereby the light output efficiency is lowered.

If the refractive index of the protective insulating film 9 is made smaller than the refractive index of the protective insulating film 6, part of light radiated to the chip side face totally reflects on the interface between the protective insulating film 6 and the protective insulating film 9 to reflect to the inside of the chip. Thus, the light output efficiency is further improved as compared with that of the nitride semiconductor light emitting element of FIG. 2. For example, when the protective insulating film 6 uses SiN or $ZrO_2$ and the protective insulating film 9 uses alumina ($Al_2O_3$) or SOG, the refractive index is made smaller in each semiconductor layer containing GaN, the protective insulating film 6 and the protective insulating film 9, the smallness of the refractive index being in the listed order.

Figure 4:
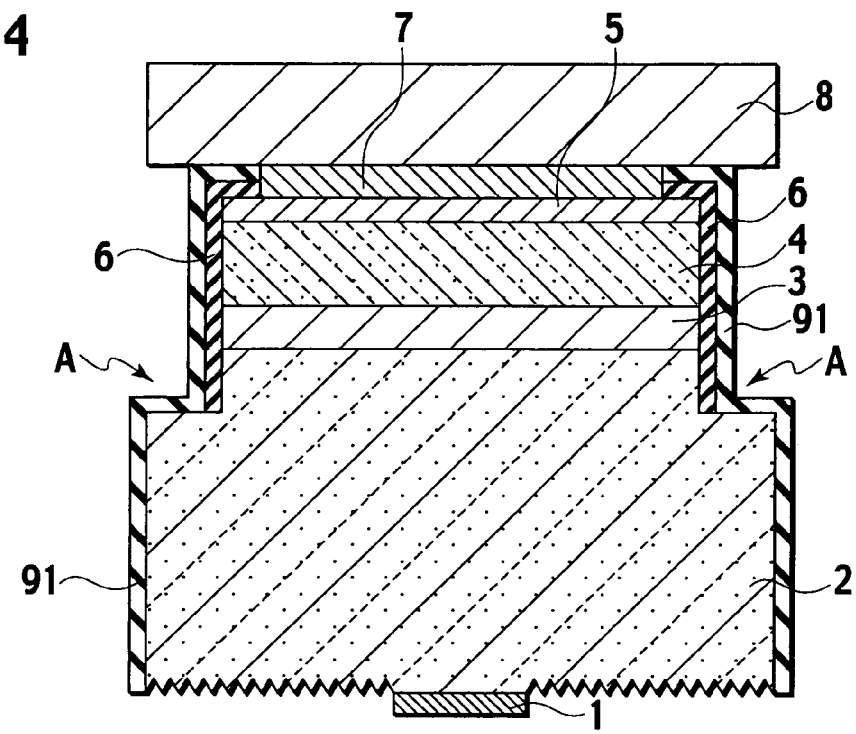
FIG. 4 is a diagram indicating another cross-sectional structure of the second nitride semiconductor light emitting element of the present invention.

In FIG. 4, the protective insulating film is doubled as in FIG. 3, however, the point different from the case in FIG. 3 is that a protective insulating film 91 outside is not formed only to the position of the step A, but is formed to the lower end of the n-type nitride semiconductor layer 2, and the protective insulating film 91 is disposed to cover the entire side face of the nitride semiconductor layer. In this manner, the protective insulating film 91 outside is formed, and the refractive index of the protective insulating film 91 is made smaller than those of the n-type nitride semiconductor layer 2, the active layer 3, the p-type nitride semiconductor layer 4 and the protective insulating film 6. These permit much light to be guided in the n electrode 1 direction by: total reflection light on the interface between the n-type nitride semiconductor layer 2 and the protective insulating film 91; total reflection light on the interface between the p-type nitride semiconductor layer 4 or the active layer 3 and the protective insulating film 6; and total reflection light on the interface between the protective insulating film 6 and the protective insulating film 91, improving the light output efficiency more than the case in FIG. 3.

Figure 5:
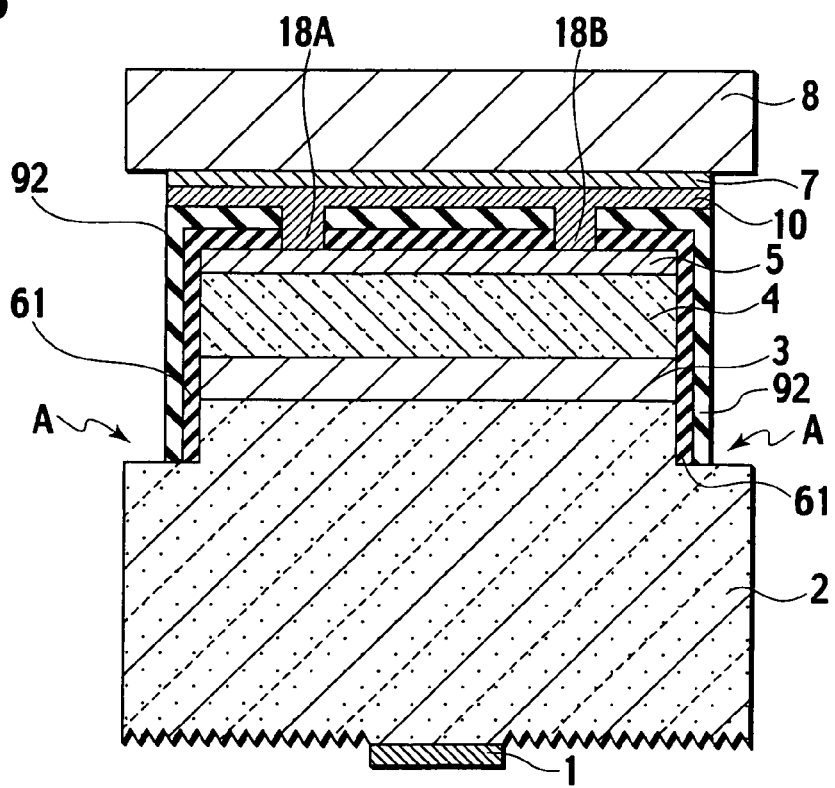
FIG. 5 is a diagram indicating another cross-sectional structure of the second nitride semiconductor light emitting element of the present invention.
Figure 6:
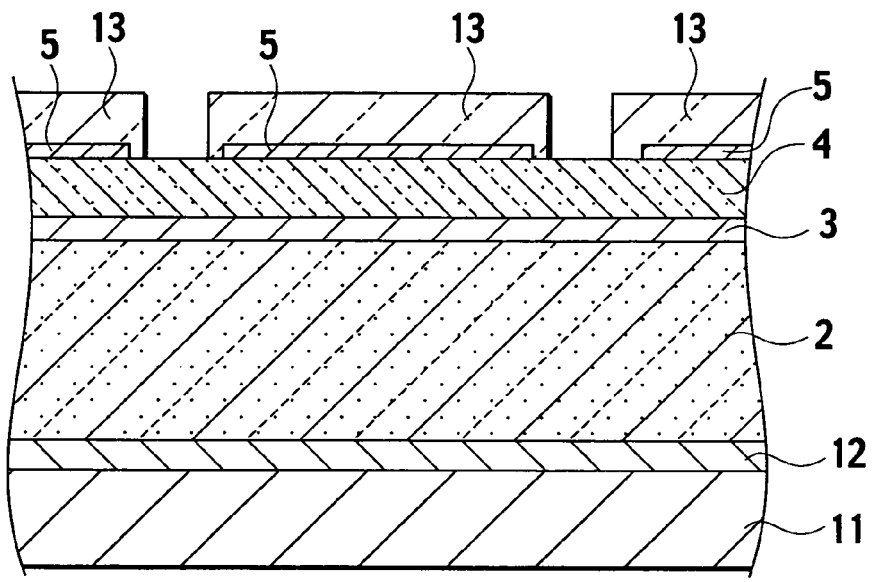
FIG. 6 is a diagram indicating a step of manufacturing a nitride semiconductor light emitting element.

FIG. 5 shows the case where a protective insulating film is doubly disposed and shows a constitution the light output efficiency of which is further improved. As in FIG. 3, dual protective insulating films, each having a different refractive index, are disposed, and a reflective film 10 is disposed. The intention is to take out not only light by total reflection from the protective insulating film of the side face but also reflected light of upward light from the reflective film 10 in the n electrode 1 direction. In this case, the p electrode must be a transparent electrode and thus uses the above described Ga doped ZnO electrode.

When a p-type GaN contact layer is used for a p-type nitride semiconductor layer, ZnO doping Ga has a similar lattice constant to GaN, good ohmic contact is formed between the ZnO doping Ga and the p-type GaN contact layer without subsequent annealing. In addition, the reflective film 10 uses a metal working as a white silver base reflective mirror such as Al or Ag. A transparent insulating film of SiN or $ZrO_2$ is used as the protective insulating film 61, and a transparent insulating film of alumina ($Al_2O_3$) is used as the protective insulating film 92.

Alumina used for the protective insulating film 92 increases adhesion between the reflective film 10 and the protective insulating film 61 thereby function as an adhesion layer for preventing detachment of the reflective film 10. The alumina also serves to increase light output efficiency by total reflection because the refractive index is decreased in a semiconductor layer containing GaN, the protective insulating film 61 and the protective insulating film 92 in the listed order. The forming method includes forming the protective insulating film 61, laminating the protective insulating film 92 (alumina) by sputtering, opening contact holes 18A, 18B by etching and subsequently forming the reflective film 10 by vapor deposition.

The reflective film 10 is not directly and totally laminated on top surface of the p electrode 5 and is formed so that a part of the reflective film 10 directly makes contact with the p electrode 5 via the small contact holes 18A, 18B. The other region of the reflective film 10 is formed with the protective insulating films 61, 92 interposed therebetween. This is because, if the p electrode 5 is made contact with the almost entire surface of the reflective film 10, an absorption of light between the p electrode 5 and the reflective film 10 occurs to decrease the reflectance. It is assumed that a white silver base metal such as Al or Ag forms an ohmic contact with Ga-doped ZnO to reduce the reflectance of the reflective film 10 due thereto.

Hence, as illustrated in FIG. 5, if the contact is only made in the contact holes 18A, 18B, the absorption of light occurs only in the contact holes 18A, 18B and a high reflectance can be maintained. In addition, as described above, since the refractive index is decreased in the semiconductor layer containing GaN, the protective insulating film 61 and the protective insulating film 92 in the listed order, the light output efficiency by total reflection is improved. However, light with a small incident angle, for example, light injected almost in a straightforward direction is not subjected to total reflection, so the light is also made to be reflected on the reflective film 10 and made to be taken out on the n electrode 1 side. Furthermore, the protective insulating film 92 outside may also be formed, as shown in FIG. 4, up to the lower end of the n-type nitride semiconductor layer 2.

What is claimed is:

1. A nitride semiconductor light emitting element including at least an n side electrode, an n-type nitride semiconductor layer, a light emitting region, a p-type nitride semiconductor layer and a p side electrode in listed order, characterized by comprising a step provided between the light emitting element and the n side electrode, and
   a first protective insulating film formed in a laminated direction from the p side electrode to the position of the step, and
   a second protective insulating film formed outside the first protective insulating film and formed to the lower end of the n-type nitride semiconductor layer, the second protective insulating film having a smaller refractive index than that of the first protective insulating film, wherein:
the n-type nitride semiconductor layer includes an upper surface, a lower surface and a side face that bridges the upper surface and the lower surface;
the n side electrode comes in contact with the lower surface of the n-type nitride semiconductor layer; and
the second protective insulating film covers the entire side face of the n-type nitride semiconductor layer.

2. The nitride semiconductor light emitting element according to claim 1, characterized in that
the first protective insulating film has a smaller refractive index than the n-type nitride semiconductor layer and the p-type nitride semiconductor layer.

3. A nitride semiconductor light emitting element including at least an n side electrode, an n-type nitride semiconductor layer, a light emitting region, a p-type nitride semiconductor layer and a p side electrode in listed order, characterized by comprising a step provided between the light emitting element and the n side electrode, and
a first protective insulating film formed in a laminated direction from the p side electrode to the position of the step, and
a second protective insulating film formed outside the first protective insulating film and formed to the lower end of the n-type nitride semiconductor layer, the second protective insulating film having a smaller refractive index than that of the first protective insulating film, wherein:
the n-type nitride semiconductor layer includes an upper surface, a lower surface and a side face that bridges the upper surface and the lower surface, the step being provided in the side face, the side face including an upper part with respect to the step and a lower part with respect to the step; and
the first protective insulating film covers only the upper part of the side face of the n-type nitride semiconductor layer, without covering the lower part of the side face of the n-type nitride semiconductor layer.

4. The nitride semiconductor light emitting element according to claim 3, characterized in that
the first protective insulating film has a smaller refractive index than the n-type nitride semiconductor layer and the p-type nitride semiconductor layer.

* * * * *